(12) United States Patent  
Lin

(10) Patent No.: US 9,025,367 B1  
(45) Date of Patent: May 5, 2015

(54) METHOD AND APPARATUS FOR SENSING TUNNEL MAGNETO-RESISTANCE

(71) Applicant: Realtek Semiconductor Corp., Hsinchu (TW)

(72) Inventor: Chia-Liang Lin, Fremont, CA (US)

(73) Assignee: Realtek Semiconductor Corp., Hsinchu (TW)

(*) Notice: Subject to any disclaimer, the term of this patent is extended or adjusted under 35 U.S.C. 154(b) by 0 days.

(21) Appl. No.: 14/089,893

(22) Filed: Nov. 26, 2013

(51) Int. Cl.  
G11C 11/00 (2006.01)  
G11C 11/16 (2006.01)

(52) U.S. Cl.  
CPC ........ G11C 11/1673 (2013.01); G11C 11/1675 (2013.01)

(58) Field of Classification Search  
CPC .............................. G11C 11/161; G11C 11/16  
USPC .................................................. 365/158, 173  
See application file for complete search history.

(56) References Cited

U.S. PATENT DOCUMENTS

| | | | |
|---|---|---|---|
| 6,262,625 B1* | 7/2001 | Perner et al. ...................... 330/2 |
| 6,982,908 B2* | 1/2006 | Cho .............................. 365/158 |
| 7,936,590 B2* | 5/2011 | Park et al. ...................... 365/158 |
| 2004/0240255 A1* | 12/2004 | Smith et al. ................... 365/158 |
| 2014/0071739 A1* | 3/2014 | Kim et al. ..................... 365/158 |

OTHER PUBLICATIONS

Kawahara et al, "2 Mb SPRAM (Spin-Transfer Torque RAM) With Bit-by-Bit Bi-Directional Current Write and Parallelizing-Direction Current Read," IEEE Journal of Solid State Circuits, vol. 43, No. 1, Jan. 2008.

* cited by examiner

*Primary Examiner* — Michael Tran  
(74) *Attorney, Agent, or Firm* — McClure, Qualey & Rodack, LLP

(57) ABSTRACT

In one embodiment, an apparatus comprises: an MRAM (magnetic random access memory) cell array comprising a plurality of MRAM cells including a calibration cell and a plurality of data cells; a reference MRAM cell controlled by a control signal; and a sensing-amplifier/latch; wherein: said plurality of data cells are used for storing user data; the calibration cell is used for a calibration purpose; the reference MRAM cell serves as a reference for comparison with a MRAM cell selected within the MRAM cell array; the sensing-amplifier/latch outputs a logical signal based on comparing a resistance of the MRAM cell selected within the MRAM cell array and a resistance of the reference MRAM cell; and the control signal is established in a calibration process by comparing a resistance of the calibration cell with the resistance of the reference MRAM cell.

20 Claims, 5 Drawing Sheets

METHOD AND APPARATUS FOR SENSING TUNNEL MAGNETO-RESISTANCE

TECHNICAL FIELD

The present invention relates to tunnel magneto-resistance.

BACKGROUND

STT-MRAM (spin torque transfer magneto-resistive magnetic random-access memory) is a promising candidate for next generation nonvolatile memory. A STT-MRAM comprises a plurality of MRAM cells. A MRAM cell 100, as depicted in FIG. 1, comprises a tunnel magneto-resistance device (TMR for short hereafter) 110 for storing a data, and an enabling NMOS (n-channel metal oxide semiconductor) switch 120 for enabling an access to TMR 110. The enabling NMOS switch 120 is controlled by a word line (WL); when WL is high, TMR 110 can be accessed via a bit line (BL) and a source line (SL). TMR 110 comprises: a ferromagnetic free layer 113, an insulating barrier layer 112, and a ferromagnetic fixed layer 111. The ferromagnetic fixed layer 111 is magnetized to a fixed orientation, while the ferromagnetic free layer 113 is magnetized to an orientation either parallel or anti-parallel to the orientation of the ferromagnetic fixed layer 111, depending on the data stored in TMR 110. If binary "1" is stored, TMR 110 is in an anti-parallel state and electrically behaves as a resistor of a high resistance. If binary "0" is stored, TMR 110 is in a parallel state and electrically behaves as a resistor of a low resistance. The resistance of TMR 110, either high or low, is a function of an electrical current flowing through it. A typical transfer characteristics 200 between the electrical current (with polarity defined in accordance with the direction flowing from BL to SL; i.e., the electrical current is said to be negative if it flows from SL to BL) and the resistance of TMR 110 are depicted in FIG. 2. As shown, TMR 110 exhibits a high resistance when it is in the anti-parallel state and a low resistance when it is in the parallel state. However, TMR 110 can stay in the anti-parallel (i.e. high resistance) state only if the electrical current is below a $1^{st}$ threshold (which is positive); when the electrical current is positive and above the $1^{st}$ threshold, TMR 110 will be programmed to (i.e., written into) the parallel state, as indicated by REGION I, even if it is previously in the anti-parallel state. Likewise, TMR 110 can stay in the parallel (i.e. low resistance) state only if the electrical current is above a $2^{nd}$ threshold (which is negative); if the electrical current is negative and below the $2^{nd}$ threshold, the TMR will be programmed to (i.e., written into) the anti-parallel state, as indicated by REGION III, even if it is previously in the parallel state. Based on the transfer characteristics 200, one can figure out methods to write to and read from TMR 110. To write a binary "0" data into TMR 110, one needs make it enter REGION I by applying a positive electrical current (flowing from BL to SL) above the $1^{st}$ threshold (i.e. more positive than the $1^{st}$ threshold); to write a binary "1" data into TMR 110, one needs to make it enter REGION III by applying a negative electrical current (i.e. flowing from SL to BL) below the $2^{nd}$ threshold (i.e. more negative than the $2^{nd}$ threshold). To read the data stored in TMR 110, one needs to make it stay in REGION II by applying an electrical current between the $2^{nd}$ threshold and the $1^{st}$ threshold (i.e., no more positive than the $1^{st}$ threshold and also no more negative than the $2^{nd}$ threshold); this electrical current will cause a voltage difference between BL and SL; and the voltage difference depends on the state of TMR 110: the voltage difference is larger if TMR 110 is in the anti-parallel state, and smaller otherwise. One then compares the voltage difference between BL and SL with a reference voltage. If the voltage difference is larger than the reference voltage, TMR 110 is detected to be in the anti-parallel state and the data stored is deemed binary "1"; if the voltage difference is smaller than the reference voltage, TMR 110 is detected to be in the parallel state and the data stored is deemed binary "0." It is not easy, however, to establish a reliable reference voltage for the read operation, because the resistance of a TMR, either high or low, is temperature dependent, and so is the voltage difference between BL and SL.

Conventional systems may include a STT-MRAM circuitry that includes a write circuit and a read circuit. In the read circuit, the reference voltage for the read operation is established by using a NMOS (n-channel metal-oxide semiconductor) transistor, the resistance of which is controlled by a voltage, to mimic a resistor of resistance that is lower than the high resistance (when the TMR is in the anti-parallel state) but higher than the low resistance (when the TMR is in the parallel state) over the entire temperature range of interest. This arrangement, however, does not lead to optimal performance for all temperatures. In the write circuit, a bi-directional driver may be used; the circuit, however, is quite complex.

SUMMARY

In one embodiment, an apparatus comprises: an MRAM (magnetic random access memory) cell array comprising a plurality of MRAM cells including a calibration cell and a plurality of data cells; a reference MRAM cell controlled by a control signal; and a sensing-amplifier/latch; wherein: said plurality of data cells are used for storing user data; the calibration cell is used for a calibration purpose; the reference MRAM cell serves as a reference for comparison with a MRAM cell selected within the MRAM cell array; the sensing-amplifier/latch outputs a logical signal based on comparing a resistance of the MRAM cell selected within the MRAM cell array and a resistance of the reference MRAM cell; and the control signal is established in a calibration process by comparing a resistance of the calibration cell with the resistance of the reference MRAM cell.

In one embodiment, an apparatus comprises: a first MRAM (magnetic random access memory) cell array comprising a first reference cell controlled by a first control signal, a first calibration cell, and a first set of data cells; a second MRAM cell array comprising a second reference cell controlled by a second control signal, a second calibration cell, and a second set of data cells; and a sensing-amplifier/latch; wherein: the first control signal is established in a first calibration process by detecting a difference between the first reference cell and the second calibration cell using the sensing-amplifier/latch; the second control signal is established in a second calibration process by sensing a difference between the second reference cell and the first calibration cell using the sensing-amplifier/latch; during a read operation for a selected data cell among the first set of data cells, a state of the selected data cell is detected by sensing a difference between the selected data cell and the second reference cell; and during a read operation for a selected data cell among the second set of data cells, a state of the selected data cell is detected by sensing a difference between the selected data cell and the first reference cell.

In one embodiment, a method comprises: incorporating a calibration MRAM cell into a MRAM cell array; presetting the calibration MRAM cell to a first state; incorporating a reference MRAM cell controlled by a control signal; presetting the reference MRAM cell to a second state; presetting the reference control signal to a first value such that a resistance of the reference MRAM cell is equal to a resistance of the calibration MRAM cell if the calibration MRAM cell were preset in the second state; gradually adjusting the control signal until it reaches to a second value where the resistance of the reference MRAM cell is equal to the resistance of the calibration MRAM that has been preset to the first state; choosing a mean value between the first value and second value as a calibrated value for the control signal; and using the reference MRAM cell with the calibrated value for the control signal as a reference for detecting a state of a MRAM cell selected within the MRAM cell array when a read operation is performed.

Other systems, methods, features, and advantages of certain embodiments of the present invention will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of certain embodiments of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

The present invention relates to tunnel magneto-resistance, in particular to sensing a tunnel magneto-resistance. For instance, certain embodiments of the invention comprise a STT-MRAM with a better read performance. While the specification describes several example embodiments of the invention considered best modes of practicing the invention, it should be understood that the invention can be implemented in many ways and is not limited to the particular examples described below or to the particular manner in which any features of such examples are implemented. In other instances, well-known details are not shown or described to avoid obscuring aspects of the invention.

Figure 1:
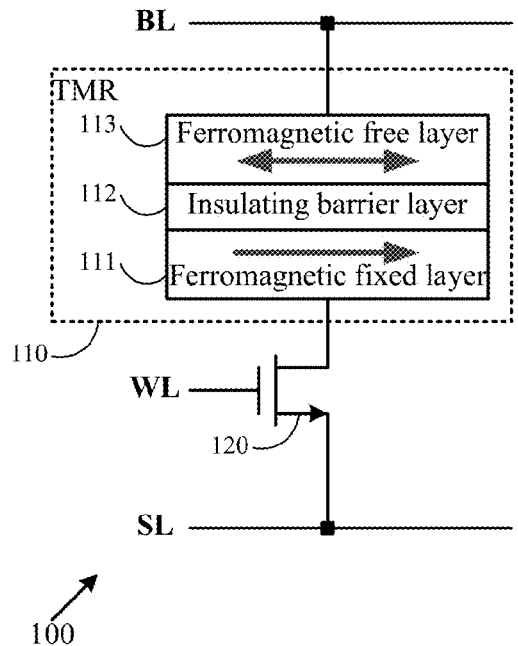
FIG. 1 shows a schematic diagram of a MRAM cell.
Figure 3:
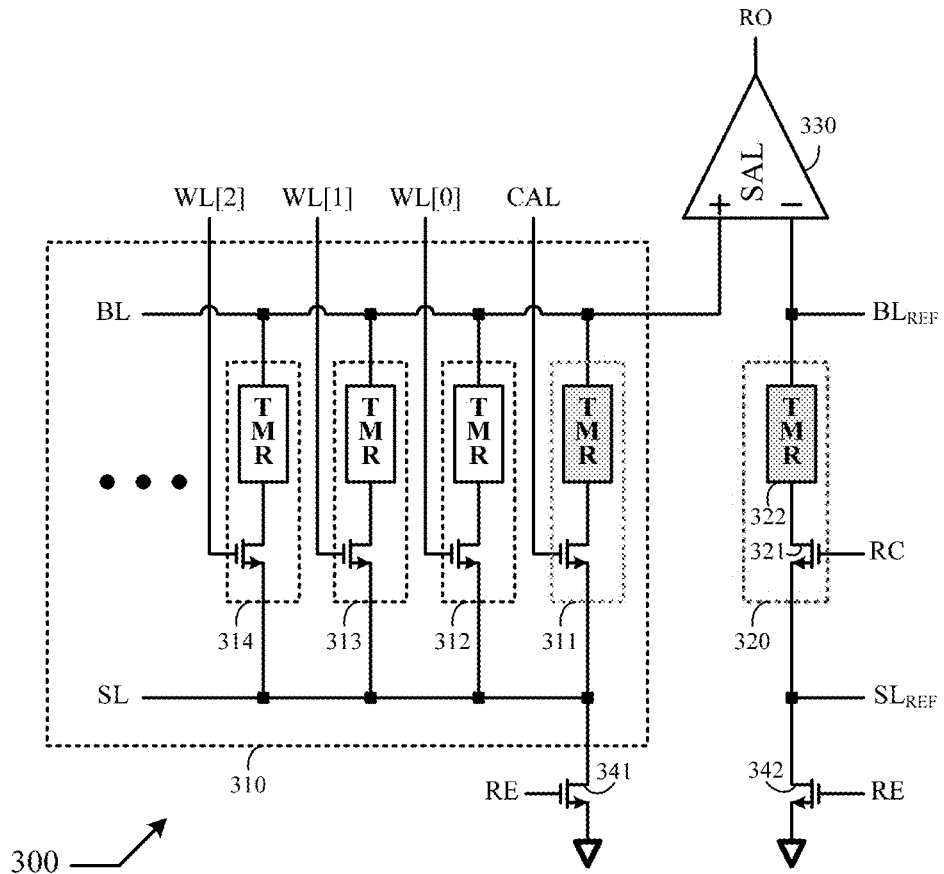
FIG. 3 shows an embodiment of a read circuit for a MRAM in accordance with the present invention.

An exemplary circuit 300 in accordance with an embodiment of the present invention is depicted in FIG. 3. Circuit 300 comprises: a MRAM array 310; a sensing-amplifier/latch (SAL) 330; and a reference cell 320. MRAM array 310 comprises: a calibration cell 311 and a plurality of data cells 312, 313, 314, . . . , and so on. Calibration cell 311 and said plurality of data cells 312, 313, 314, . . . , and so on, are all of the same circuit as MRAM cell 100 of FIG. 1; each of them comprises a respective TMR and a respective enabling NMOS switch controlled by a respective logical signal. Said plurality of data cells 312, 313, 314, . . . , and so on, are used to store user data, while calibration cell 311 is used for calibration purposes. Calibration cell 311 and said plurality of data cells 312, 313, 314, . . . , and so on, are connected in parallel by tying the bit line (BL) together at the top and tying the source line (SL) together at the bottom. Access to calibration cell 311 is controlled by a calibration (CAL) signal, while access to said plurality of data cells 312, 313, 314, . . . , and so on, is controlled by a plurality of word-line (WL) signals WL[0], WL[1], WL[2], . . . , and so on. By default, the calibration signal CAL and said plurality of word-line (WL) signals WL[0], WL[1], WL[2], . . . , and so on, are all set low (i.e., binary "0") except when a command to access (either read or write operation) the MRAM array 310 is issued. Of the calibration cell 311 and said plurality of data cells 312, 313, 314, . . . , and so on, only one can be accessed at the same time; that is, only one of CAL and WL signals can be set high (i.e., binary "1") at the same time. For instance, when the calibration cell 311 is accessed, CAL is set high and all WL signals (i.e., WL[0], WL[1], WL[2], . . . , and so on) must be set low; when data cell 312 is accessed, WL[0] is set high and CAL and the rest of WL signals (WL[1], WL[2], . . . , and so on) must be set low; when data cell 313 is accessed, WL[1] is set high and CAL and the rest of WL signals (WL[0], WL[2], . . . , and so on) must be set low. The reference cell 320 is also of the same circuit as the MRAM cell 100 of FIG. 1; its bit line (at the top) is labeled as $BL_{REF}$, its source line (at the bottom) is labeled as $SL_{REF}$; its enabling NMOS switch 321 is controlled by a reference control (RC) signal. The circuit 300 further comprises two NMOS switches 341 and 342 controlled by a read enabling signal RE. During a read operation, RE is set high, effectively grounding SL and $SL_{REF}$ via NMOS switches 341 and 342, respectively; depending on which MRAM cell inside the MRAM array 310 is to be read, either CAL or one of the word line signals (e., WL[0], WL[1], WL[2], . . . , and so on) is set high. During the read operation, the SAL circuit 330 establishes a voltage level at BL in response to the resistance looking into BL, and also establishes a voltage level at $BL_{REF}$ in response to the resistance looking into $BL_{REF}$. The SAL circuit 330 compares voltage levels of BL and $BL_{REF}$ and outputs a logical read-out signal RO: RO is set high if BL is higher than $BL_{REF}$ (in voltage level), and set low otherwise. A principle of the circuit 300 is described in the following paragraphs.

Figure 2:
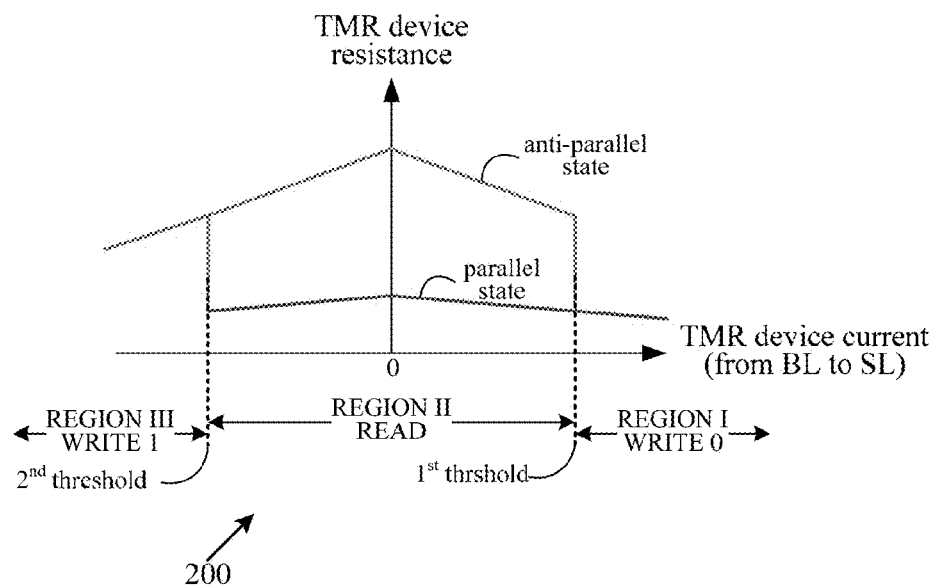
FIG. 2 shows a typical transfer characteristic of TMR.

During the read operation, only one particular MRAM cell selected within the MRAM array 310 is accessed; the enabling NMOS switch within that particular MRAM cell is closed, while the NMOS switches of the rest of the MRAM cells are open. Since only the particular MRAM cell is accessed, the resistance (seen by SAL 330) at BL solely depends on a resistance of the particular MRAM cell being accessed. Therefore, the resistance (seen by SAL 330) at BL is of a high value if the TMR within the particular MRAM cell is in the anti-parallel state, or of a low value otherwise (see FIG. 2). Therefore, the voltage at BL is either of a high level or a low level. On the other hand, the resistance at $BL_{REF}$ (seen by SAL 330) depends on the state of TMR 322 within the reference cell 320 and the control signal RC. In an embodiment, TMR 322 is preset and fixed in the parallel state. The reference cell 320 is calibrated by properly setting the control signal RC so as to establish a proper value for the resistance at $BL_{REF}$ such that the voltage level at $BL_{REF}$ is mid way between the high level and the low level of the voltage at BL. As a result, if BL is higher than $BL_{REF}$ (in voltage level), it indicates the TMR of the particular MRAM cell within the MRAM array 310 that is currently being accessed is in the anti-parallel state; if BL is lower than $BL_{REF}$ (in voltage level), it indicates the TMR of the particular MRAM cell within the MRAM array 310 that is currently being accessed is in the parallel state. Since the voltage level at $BL_{REF}$ is mid way between the high level and the low level of the voltage at BL, the read operation has the widest possible noise margin. Besides, the reference cell 320 and all the data cells (312, 313, 314, . . . , and so on) are all built from the same circuit; this allows the reference cell to track well with the data cells under temperature variation, and thus outperform methods used by some conventional systems. The reference signal RC is determined by a calibration process based on comparing the calibration cell 311 and the reference cell 320. The calibration process is described as below.

Figure 4:
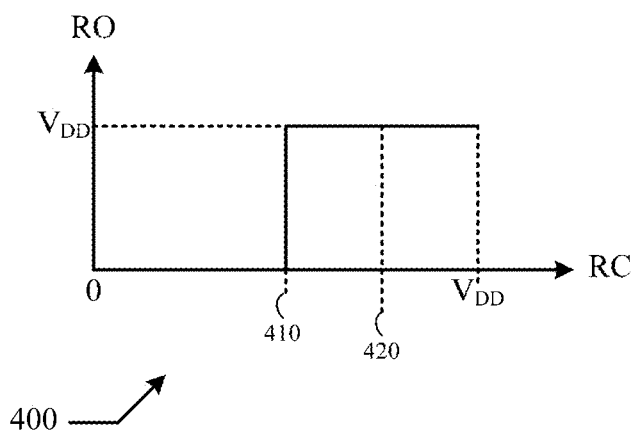
FIG. 4 shows a relation between the control signal and the read-out signal for the embodiment of FIG. 3.

Upon system startup, the TMR within the calibration cell 311 is preset to be in the anti-parallel state, while the TMR within the reference cell 320 is preset to be in the parallel state. During calibration, the read enabling signal RE is set high, the calibration signal CAL is also set high, while the word line signals WL[0], WL[1], WL[2], . . . , and so on, are all set low. Under these arrangements, the resistance of the calibration cell 311 is effectively compared with the resistance of the reference cell 320. Note that CAL, WL, and RO are all logical signals; here, a voltage level of a logical signal is either $V_{DD}$, which is a power supply voltage level, or 0, which is a ground voltage level. The control signal RC, on the other hand, is not a logical signal, but an analog signal of a voltage level between $V_{DD}$ and 0. A transfer relation between the control signal RC and the logical read-out signal RO is depicted in FIG. 4. When the control signal RC is set to 0: the NMOS switch 321 is effectively open and the resistance seen by SAL 330 at $BL_{REF}$ is very large and greater than the resistance seen by SAL 330 at BL, therefore $BL_{REF}$ will be higher than BL (in voltage level), and the resultant read-out signal RO will be 0. As the level of the reference signal RC increases, the resistance at $BL_{REF}$ decreases because the resistance of the NMOS switch 321 decreases. When the level of the control signal RC reaches a point 410, the resistance at $BL_{REF}$ is the same as the resistance at BL. When the level of control signal RC rises above the point 410, the resistance at $BL_{REF}$ is smaller than the resistance at BL, causing $BL_{REF}$ to be lower than BL in voltage level and thus causing the logical read-out signal RO to be $V_{DD}$ (logical high). When the level of RC reaches $V_{DD}$, the resistance at $BL_{REF}$ will be the same as the resistance at BL in a hypothetical case where the TMR of the calibration cell 311 is preset to parallel. In summary, when RC is at point 410 the reference cell 320 behaves similarly to a MRAM cell (within the MRAM cell array 310) with the internal TMR being in the anti-parallel state, and when RC is at $V_{DD}$ the reference cell 320 behaves similarly to a MRAM cell (within the MRAM cell array 310) with the internal TMR being in the parallel state. A calibrated value (e.g., tan optimum level) for the control signal RC is approximately at point 420, which is mid-way between point 410 and $V_{DD}$, so that the resistance at $BL_{REF}$ is approximately mid-way between the resistance at BL when the TMR of the MRAM cell being accessed is in the parallel state and the resistance at BL when the TMR of the MRAM being accessed is in the anti-parallel state. In an embodiment, the control signal RC is an output of a DAC (digital-to-analog converter). The maximum output voltage of the DAC is the supply voltage $V_{DD}$. At the beginning of the calibration, the control code of the DAC is set to maximum, causing the control signal RC to be $V_{DD}$. As explained earlier, this will cause the logical read-out signal RO to be $V_{DD}$. The control code of the DAC is gradually reduced, until the read-out signal RO toggles to 0. When that happens, the control code will be corresponding to point 410. Then, the control code that corresponds to point 420 is approximately an average of the control code corresponding to point 410 and the maximum control code. In this manner, the control code that corresponds to point 420 is established, and so is the optimum level for the control signal RC. Note that after calibration, the control signal RC is set to the optimum level only during a read operation; if no read operation is undergoing, the control signal RC must be set to 0.

Figure 5:
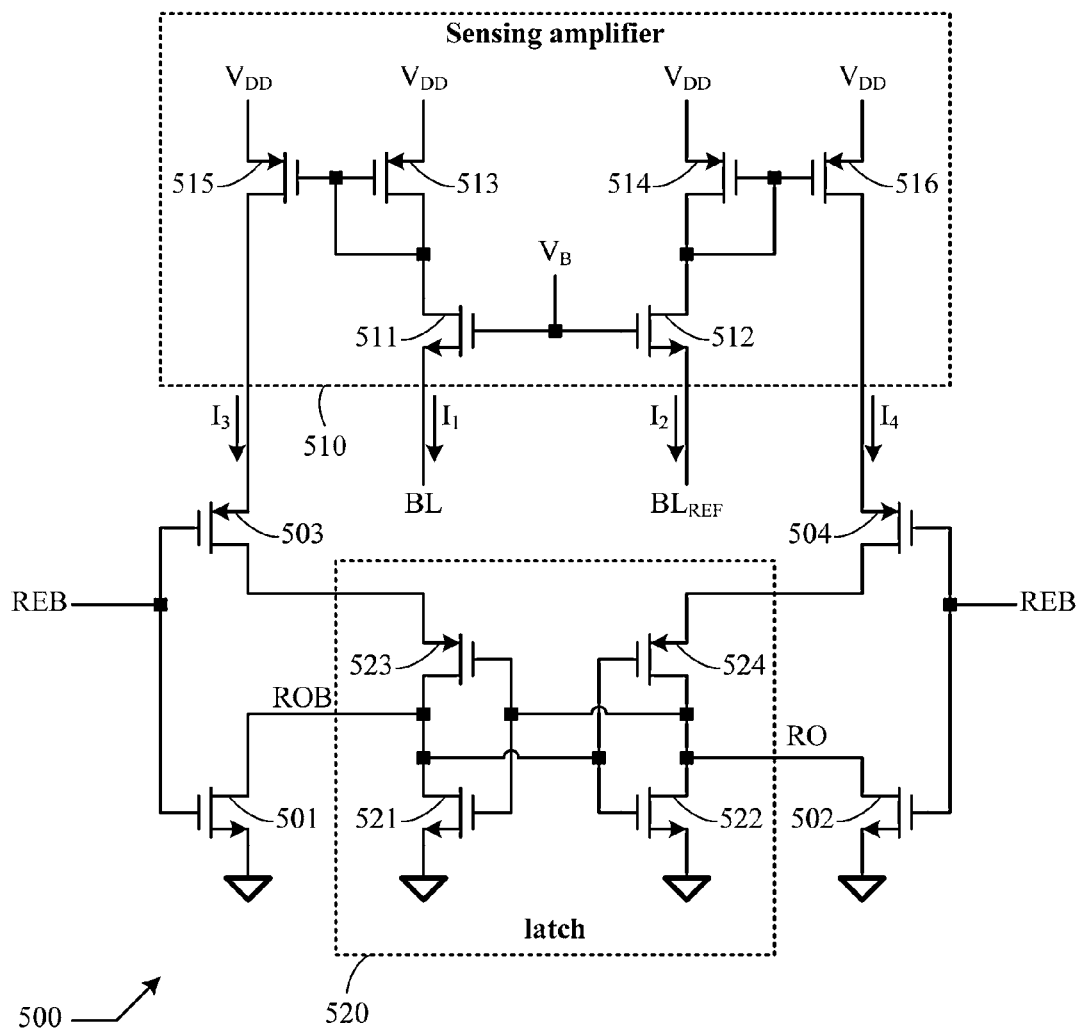
FIG. 5 shows an embodiment of a sensing-amplifier/latch for the embodiment of FIG. 3.

A SAL (sensing-amplifier/latch) 500 suitable for embodying SAL 330 of FIG. 3 is depicted in FIG. 5. SAL 500 comprises a sensing amplifier 510 and a latch 520. The sensing amplifier 510 comprises: a pair of NMOS transistors 511 and 512 for interfacing with BL and $BL_{REF}$, resulting in currents $I_1$ and $I_2$ in response to resistances at BL and $BL_{REF}$, respectively; a first current mirror comprising PMOS transistors 513 and 515 for mirroring current $I_1$ into current $I_3$; and a second current mirror comprising PMOS transistors 514 and 516 for mirroring current $I_2$ into current $I_4$. Latch 520 comprises NMOS transistors 521 and 522 and PMOS transistors 523 and 524 configured in a cross-coupled inverters configuration for outputting the read-out signal RO and its logical complement ROB. When $I_3$ is smaller than $I_4$, RO rises faster than ROB, and RO and ROB will be latched to $V_{DD}$ and 0, respectively. When $I_3$ is larger than $I_4$, ROB rises faster than RO, and ROB and RO will be latched to $V_{DD}$ and 0, respectively. Within sensing-amplifier 510, NMOS transistors 511 and 512 are biased by a biasing voltage $V_B$. When the resistance at BL is higher (than the resistance at $BL_{REF}$), the voltage at BL will be higher (than the voltage at $BL_{REF}$), and $I_1$ will be smaller than $I_2$, causing $I_3$ to be smaller than $I_4$, and thus causing RO to be latched to $V_{DD}$. When the resistance at BL is lower (than the resistance at $BL_{REF}$), the voltage at BL will be lower (than the voltage at $BL_{REF}$), and $I_1$ will be larger than $I_2$, causing $I_3$ to be larger than $I_4$, and thus causing RO to be latched to 0. SAL 500 further comprises: NMOS transistors 501 and 502, and PMOS transistors 503 and 504; all of them are controlled by a logical signal REB, which is a logical inversion of the read enabling signal RE of FIG. 3. When RE is low, REB is high, the latch 520 is decoupled from the sensing-amplifier 510 because PMOS transistors 503 and 504 are turned off, and both RO and ROB are preset to 0 since NMOS transistors 501 and 502 are turned on. When RE toggles from low to high, the latch 520 is coupled to the sensing-amplifier 510 via PMOS transistors 503 and 504, NMOS transistors 501 and 502 are turned off, and the latch 520 performs the aforementioned latch function that makes RO either high or low, depending on whether $I_3$ is lower than $I_4$.

Figure 6A:
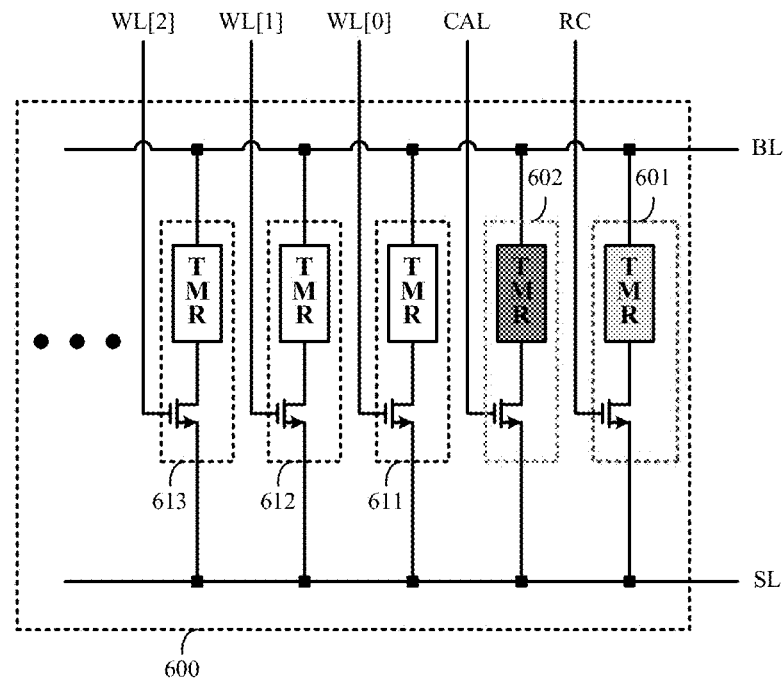
FIG. 6A shows an embodiment of a supplemented MRAM cell array.
Figure 6B:
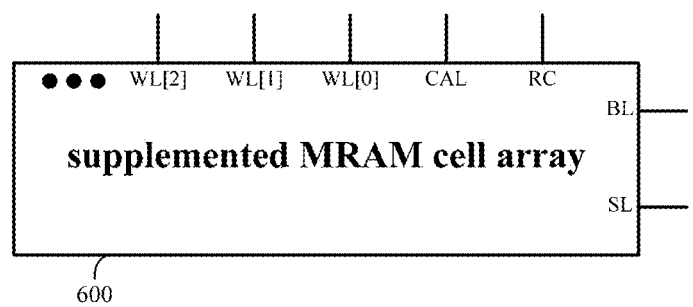
FIG. 6B shows a circuit symbol of the supplemented MRAM cell array of FIG. 6A.
Figure 7:
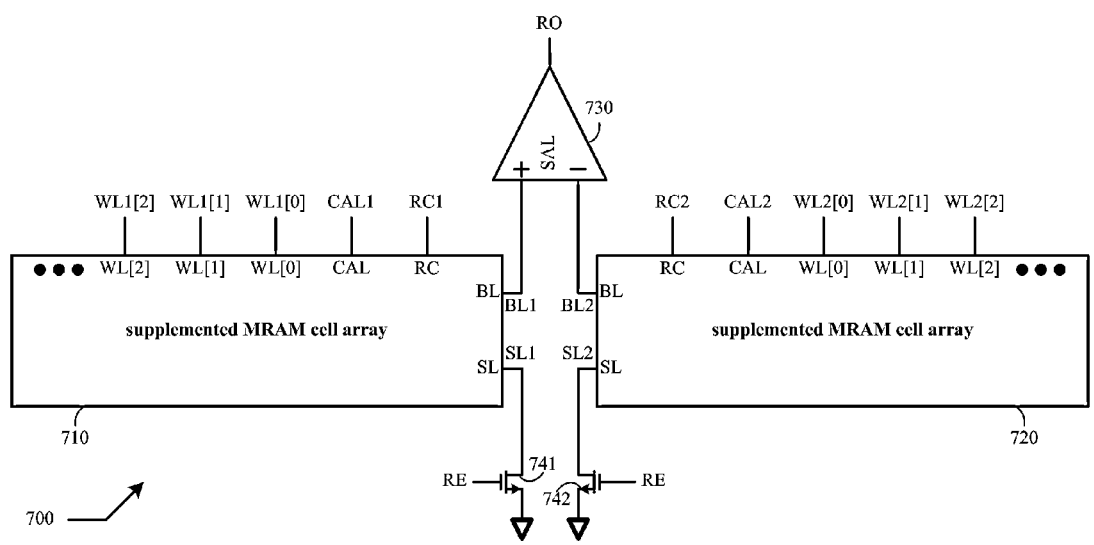
FIG. 7 shows an alternative embodiment of a read circuit for a MRAM in accordance with the present invention.

The circuit 300 of FIG. 3 is not symmetrical in physical layout, because SAL 330 is comparing a MRAM cell array 310 (which comprises a plurality of MRAM cells, although only one of them can be accessed at the same time) with a calibration cell 311 (which comprises only a single MRAM cell). To allow symmetry in physical layout, in an alternative embodiment, a supplemented MRAM cell array 600, as depicted in FIG. 6A, is used. Supplemented MRAM cell array 600 comprises: a reference cell 601, a calibration cell 602, and a plurality of data cells 611, 612, 613, . . . , and so on. Supplemented MRAM cell array 600 is the same as the MRAM cell array 310 of FIG. 3 but supplemented with an incorporation of the reference cell 320 of FIG. 3. A circuit symbol of the supplemented MRAM cell array 600 is shown in FIG. 6B. In an application circuit, the supplemented MRAM cell array 600 of FIG. 6 is to be used in pair, as illustrated by an embodiment 700 shown in FIG. 7. Embodiment 700 comprises: two supplemented MRAM cell arrays 710 and 720, and SAL 730. For supplemented MRAM array 710: control signal RC1 is used to control the reference cell therein; calibration signal CAL1 is used to control the calibration cell therein; and word-line signals WL1[0], WL1[1], WL1[2], . . . , and so on are used to control the data cells therein; the bit-line interfaces with net BL1; and the source line interfaces with net SL1. For supplemented MRAM array 720: control signal RC2 is used to control the reference cell therein; calibration signal CAL2 is used to control the calibration cell therein; and word-line signals WL2[0], WL2[1], WL2[2], . . . , and so on, are used to control the data cells therein; the bit-line interfaces with net BL2; and the source-line interfaces with net SL2. The embodiment 700 further comprises two NMOS switches 741 and 742 controlled by a read enabling signal RE. During a read operation, RE is set high, effectively grounding SL1 and SL2 via NMOS switches 741 and 742, respectively; and SAL 730 compares the resistance at BL1 with the resistance at BL2 and outputs the logical read-out signal RO accordingly. By default, RC1, CAL1, WL1[0], WL1[1], WL1[2], . . . , and so on, RC2, CAL2, WL2[0], WL2[1], WL2[2], . . . , and so on, are all set low (zero voltage). When supplemented MRAM array 710 is to be read, supplemented MRAM array 720 will serve to provide a reference; in this case, either CAL1 or one of WL1[0], WL1[1], WL1[2], . . . , and so on, is set high, and RC2 is set to an optimum level obtained from a calibration process. When supplemented MRAM array 720 is to be read, supplemented MRAM array 710 will serve to provide reference; in this case, either CAL2 or one of WL2[0], WL2[1], WL2[2], . . . , and so on, is set high, and RC1 is set to an optimum level obtained from a calibration process. The calibration process is similar to that described above. By default, unless otherwise specified, RC1, CAL1, WL1[0], WL1[1], WL1[2], . . . , and so on, RC2, CAL2, WL2[0], WL2[1], W2L[2], . . . , and so on, are all set to low (zero voltage level). When calibrating supplemented MRAM array 710, CAL1 is set high, and RC2 is gradually lowered from $V_{DD}$ until the result of RO toggles, and the optimum level may be a mean level between $V_{DD}$ and the level at which RO toggles. Likewise, when calibrating supplemented MRAM array 720, CRL2 is set high, and RC1 is gradually lowered from $V_{DD}$ until the result of RO toggles, and the optimum level may be a mean value between $V_{DD}$ and the level at which RO toggles. In this manner, the two supplemented MRAM cell arrays are first cross-calibrated and then cross-referenced.

Note that TMR is an example of a non-volatile memory device. The principle disclosed in this disclosure can be applied to any non-volatile memory device that exhibits a resistance that is dependent on a state of the non-volatile memory device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An apparatus, comprising:
an MRAM (magnetic random access memory) cell array, comprising:
a plurality of MRAM cells, comprising:
a calibration cell for a calibration; and
a plurality of data cells for storing user data;
a reference MRAM cell controlled by a control signal; and
a sensing-amplifier/latch for outputting a logical signal based on comparing a resistance of the MRAM cell selected within the plurality of MRAM cells and a resistance of the reference MRAM cell, wherein the control signal is established in a calibration process by comparing a resistance of the calibration cell with the resistance of the reference MRAM cell.

2. The apparatus of claim 1, wherein each cell comprises a tunnel magneto-resistance device and a switch.

3. The apparatus of claim 1, wherein the plurality of MRAM cells are arranged in a parallel configuration with each coupled between a bit line and a source line.

4. The apparatus of claim 3, wherein the reference MRAM cell is coupled between a reference bit line and a reference source line, wherein during a read operation, the sensing-amplifier/latch outputs a logical signal corresponding to a first latched value when the resistance sensed at the bit line is greater than the resistance sensed at the reference bit line and a second latched value when the resistance sensed at the bit line is less than the resistance sensed at the reference bit line.

5. The apparatus of claim 4, further comprising first and second switches respectively coupled to the source line and the reference source line, the first and second switches receiving a first enabling signal having a first logic value during the read operation.

6. The apparatus of claim 5, further comprising first and second pairs of switches coupling a latch of the sensing-amplifier/latch to a sensing amplifier of the sensing-amplifier/latch, the first and second pairs receiving a second enabling signal that is a logical inversion of the first enabling signal and, depending on the logical value of the second enabling signal, the first and second pairs enabling a decoupling of the sensing amplifier from the latch based on the second enabling signal.

7. The apparatus of claim 4, wherein the reference MRAM cell comprises a switch, wherein the control signal received by the reference MRAM cell switch comprises a calibrated value that enables the resistance sensed at the reference bit line to be approximately midway between a first resistance sensed at the bit line when a tunnel magneto-resistance device of the selected MRAM cell is in a parallel state and a second resistance sensed at the bit line when the tunnel magneto-resistance device is in an anti-parallel state.

8. The apparatus of claim 4, wherein the sensing-amplifier/latch comprises a sensing amplifier and a latch, wherein the sensing amplifier comprises first and second current mirrors for respectively mirroring a first current corresponding to a current on the bit line and a second current corresponding to a current on the reference bit line, the respective mirrored currents received by the latch.

9. The apparatus of claim 8, wherein the latch comprises cross-coupled inverters for outputting the logical signal and its logical complement based on the mirrored currents.

10. The apparatus of claim 1, wherein the control signal is an analog signal that is gradually adjusted during the calibration process.

11. An apparatus, comprising:
a first MRAM (magnetic random access memory) cell array, comprising:
a first reference cell controlled by a first control signal;
a first calibration cell; and
a first set of data cells;
a second MRAM cell array comprising:
a second reference cell controlled by a second control signal;
a second calibration cell; and
a second set of data cells; and
a sensing-amplifier/latch, for detecting a difference between the first reference cell and the second calibration cell to generate the first control signal in a first calibration process and detecting a difference between the second reference cell and the first calibration cell to generate the second control signal in a second calibration process;

wherein during a read operation for a selected data cell among the first set of data cells, a state of the selected data cell is detected by sensing a difference between the selected data cell and the second reference cell, and during a read operation for a selected data cell among the second set of data cells, a state of the selected data cell is detected by sensing a difference between the selected data cell and the first reference cell.

12. The apparatus of claim 11, wherein each cell comprises a tunnel magneto-resistance device and a switch.

13. The apparatus of claim 11, wherein the cells of the first MRAM cell array are arranged in a parallel configuration with each coupled between a first bit line and a first source line, and wherein the cells of the second MRAM cell array are arranged in a parallel configuration with each coupled between a second bit line and a second source line.

14. The apparatus of claim 13, wherein the sensing-amplifier/latch outputs a logical signal based on a comparison of a resistance associated with the first bit line and a resistance associated with the second bit line.

15. The apparatus of claim 11, wherein during the first and second calibration processes, the first and second control signals are gradually changed and a respective calibration value is determined based on a transition from a first value to a second value.

16. The apparatus of claim 15, wherein the calibration value comprises a mean level between the first and second values.

17. The apparatus of claim 11, further comprising first and second switches respectively coupled to the first and second source lines, the first and second switches receiving an enabling signal having a first logic value during the read operation.

18. A method, comprising:
incorporating a calibration MRAM cell into a MRAM cell array;
presetting the calibration MRAM cell to a first state;
incorporating a reference MRAM cell controlled by a control signal;
presetting the reference MRAM cell to a second state;
presetting the reference control signal to a first value such that a resistance of the reference MRAM cell is equal to a resistance of the calibration MRAM cell if the calibration MRAM cell were preset in the second state;
gradually adjusting the control signal until it reaches a second value where the resistance of the reference MRAM cell is equal to the resistance of the calibration MRAM that has been preset to the first state;
choosing a mean value between the first value and second value as a calibrated value for the control signal; and
using the reference MRAM cell with the calibrated value for the control signal as a reference for detecting a state of a MRAM cell selected within the MRAM cell array when a read operation is performed.

19. The method of claim 18, wherein each cell comprises a tunnel magneto-resistance device and a switch, wherein the first state corresponds to an anti-parallel state of the tunnel magneto-resistance device of the calibration MRAM cell, and the second state corresponds to a parallel state of the tunnel magneto-resistance device of the reference MRAM cell.

20. The method of claim 18, wherein responsive to detecting the state of the selected MRAM cell, outputting a logical signal.

* * * * *